(12) United States Patent
Simmons

(10) Patent No.: US 7,235,795 B2
(45) Date of Patent: Jun. 26, 2007

(54) SEMICONDUCTOR DEVICE MANUFACTURING APPARATUS AND A METHOD OF CONTROLLING A SEMICONDUCTOR DEVICE MANUFACTURING PROCESS

(75) Inventor: Jonathon Yancey Simmons, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 338 days.

(21) Appl. No.: 10/916,627

(22) Filed: Aug. 12, 2004

(65) Prior Publication Data

US 2006/0035396 A1 Feb. 16, 2006

(51) Int. Cl.
*H01L 21/66* (2006.01)

(52) U.S. Cl. .............................. 250/492.2; 250/492.3; 250/492.21; 250/492.23; 250/397; 438/16; 438/514; 315/111.81; 118/663

(58) Field of Classification Search ...................... None
See application file for complete search history.

(56) References Cited

U.S. PATENT DOCUMENTS

| 4,896,048 | A | | 1/1990 | Borden |
| 5,047,648 | A | * | 9/1991 | Fishkin et al. ........... 250/492.2 |
| 5,146,098 | A | | 9/1992 | Stack |
| 5,255,089 | A | | 10/1993 | Dybas et al. |
| 5,463,460 | A | | 10/1995 | Fishkin et al. |
| 5,565,985 | A | | 10/1996 | Fishkin et al. |
| 5,751,422 | A | | 5/1998 | Mitchell |
| 6,188,475 | B1 | * | 2/2001 | Inman et al. ............... 356/246 |
| 6,501,081 | B1 | | 12/2002 | Foad et al. |
| 6,909,102 | B1 | | 6/2005 | Buccos |
| 7,078,712 | B2 | * | 7/2006 | Perel et al. ............ 250/492.21 |

FOREIGN PATENT DOCUMENTS

| GB | 2 307 779 | 6/1997 |
| GB | 2 317 988 | 4/1998 |

OTHER PUBLICATIONS

S. Myers et al., "Integration of a Particle Monitor into the Control System for an Ion Implanter" in Nuclear Inst. and Methods in Physics Research B74 (1993), pp. 243-247.

J. Sedgewick et al., "In Situ Particle Monitoring in a Varian E1000HP Ion Implanter" in Ion Implantation Technology-94 (1995), pp. 579-582.

(Continued)

*Primary Examiner*—Jack I. Berman
*Assistant Examiner*—Zia R. Hashmi
(74) *Attorney, Agent, or Firm*—Boult Wade Tennant

(57) ABSTRACT

A particle monitor in the process chamber of a semiconductor device manufacturing apparatus provides a measure of a flux of contaminant particles in the chamber. The flux is measured whilst process conditions are produced in the process chamber and a process parameter is adjusted in response to the measured flux in order to reduce this flux during the process. In an ion implanter, the particle sensor measures the flux of particles entrained with the ion beam at a location in front of the wafer being processed.

14 Claims, 2 Drawing Sheets

OTHER PUBLICATIONS

J. Sedgewick et al., "In Situ Particle Monitoring in a Varian Medium Current Implanter" in Ion Implantation Technology-94 (1995), pp. 583-587.

J. Simmons et al., "Advanced In-Situ Particle Monitor for Applied Materials Implanter Applications" in Ion Implantation Technology—98 (1998), pp. 570-573.

J. Simmons et al., "Successful Integration of In-Situ Particle Monitoring into a vol. 300 mm High Current Implant Manufacturing System" in Ion Implantation Technology—02 (2002), pp. 323-326.

P. Sferlazzo et al., "Experimental Evidence for Beam Particulate Transport in Ion Implanters" in Ion Implantation Technology-92 (1993), pp. 565-569.

Patent Abstract of Japan, vol. 008, No. 135 (E-252), Jun. 22, 1984 of JP 59 046749A, Koike Hideki, "Ion Implantation Device."

S. Leung et al., "Real Time, In Situ Particle Monitoring of the Applied Materials PI9200 Ion Implanter" in Nuclear Instruments and Methods in Physics Research, B55, No. 1/4, Apr. 2, 1991, pp. 35-38.

\* cited by examiner

SEMICONDUCTOR DEVICE MANUFACTURING APPARATUS AND A METHOD OF CONTROLLING A SEMICONDUCTOR DEVICE MANUFACTURING PROCESS

FIELD OF THE INVENTION

This invention relates to the control of processes for manufacturing semiconductor devices in which desired process conditions are provided in a vacuum chamber. The invention is also concerned with improvements in semiconductor device manufacturing apparatus.

BACKGROUND OF THE INVENTION

Semiconductor manufacturing processes are used for creating and modifying structures in substrates of semiconductor material in order to create useful devices in the substrate. Many of these manufacturing processes are conducted on substrates or wafers of the semiconductor material held in a vacuum chamber and exposed to the desired process conditions. It is well understood that the processes can be affected in a harmful way by the presence on the surface of the substrate or wafer being processed of contaminant particulates which may be derived from within the process chamber. Unwanted particulates within the process chamber can be derived from a number of sources, including mechanically moving parts, electrical interactions such as arcing with interior surfaces in the vacuum chamber, and the disturbance, e.g. during venting, of pre-existing contaminant particulates within the chamber.

Embodiments and examples of this invention will be described herein with particular emphasis on ion implantation. However, the most general principles of the invention are also relevant to other semiconductor device manufacturing processes for which the presence of contaminant particulates can be a problem.

Sensors have been proposed for detecting and counting or measuring the flux of contaminant particulates within a process environment, typically in a vacuated chamber. Generally such sensors in the prior art use optical techniques in which a light source is directed into a sample region and light which may be scattered from contaminant particulates within the sample region is detected.

U.S. Pat. No. 4,896,048, for example, describes a particle detector which may be used, for example, in the field of ion implantation. The detector may be located within the vacuum chamber and light from a source is delivered to a sample region along an optical fibre. A further bundle of fibres is used to detect scattered light and communicate the scattered light signals to a sensor outside the chamber.

U.S. Pat. No. 5,751,422 discloses an optical detector in which an optical cavity is formed having a laser medium. A sensing region is defined within the optical cavity and light scattered from contaminant particulates within the sensed region in the optical cavity is communicated to a detector.

U.S. Pat. Nos. 5,463,460 and 5,565,985 disclose a further particle monitoring sensor with provision for cleaning and preventing contamination of the windows proximate the sensing region through which light is directed from the source and through which scattered light may be detected.

None of the above prior art patent specifications describes in any detail the specific use which may be made of the signals derived from the disclosed particle detectors.

U.S. Pat. No. 5,047,648 discloses a particle detector located "in situ" in the process chamber of an ion implanter so as to detect particles flying off substrates on the scan wheel of the implanter as the substrates pass through the ion beam. A maximum flux of contaminant particulates for detection is assured by locating the detector on a tangent with respect to the scan wheel at a point where the scan wheel intersects the ion beam.

The disclosed detector is said to allow the particle level within the chamber to be monitored while wafers are still being processed, so that corrective action can be taken. No details of the nature of the corrective action are given.

In fact, hitherto in the implant art, in situ particle monitors, such as described in the above U.S. patent, have been used to provide an indication of excess particle count during a process, in order to produce an alarm to operators of the implanter so that the implant process can be "gracefully" terminated, possibly before irreparable damage is done to the wafers being processed. Corrective action can then be taken, which would typically be to perform a cleaning process on the implanter, involving repeated cycles of venting of the vacuum chamber and roughing. This cleaning process tends to dislodge particulates within the vacuum chamber and allow them to be pumped out so as to reduce the total number of particulates within the chamber.

Importantly, the corrective action known in the art involves stopping the process within the vacuum chamber, i.e. terminating the desired process conditions. Further, the corrective action would involve removing wafers from the process chamber before the above described cleaning procedure. Although in some cases it might then be possible to restart the process with the previously part processed wafers, in order to complete the processing of those wafers, this may not be practicable in many instances. The importance of prior art particle detection was to ensure that corrective action was taken before further batches of wafers are installed in the machine for subsequent processing.

Reference should also be made to the following published articles:

i) Integration of a Particle Monitor into the Control System for an Ion Implanter, Myers et al, Nuclear Instruments and Methods in Physics Research B74 (1993) pages 243–247;

ii) In Situ Particle Monitoring in a Varian E1000HP Ion Implanter, Sedgewick et al, IIT-94, pages 579 to 582;

iii) In Situ Particle Monitoring in a Varian Medium Current Implanter, Sedgewick et al, IIT-94, pages 583 to 587;

iv) Advanced In Situ Particle Monitor for Applied Materials Implanter Applications, Simmons et al, IIT-98, pages 570–573;

(v) Successful Integration of In Situ Particle Monitoring into a Volume 300 mm High Current Implant Manufacturing System, Simmons et al, IIT-2002, pages 323–326.

All the above papers disclose in situ particle monitors for use in implanters. Myers et al describes the use of such a monitor to anticipate the need to clean the process chamber and to halt a current process. When a lower threshold is exceeded an alarm is posted on completion of the current implant to allow the operator to perform maintenance. A higher threshold value being exceeded may cause the current implant to be stopped. Exceeding the higher threshold value may be the result of a so called catastrophic event, such as a wafer breakage within the chamber.

The second Simmons et al paper from IIT-2002 describes an in situ particle monitor which allows each batch of wafers being processed in a batch-type implanter to be monitored and the early detection of excess particle current. As a result, particle problems can be detected earlier and fewer batches are affected, before some corrective action is taken.

All the published papers listed above confirm the established state of the art view, that in situ particle monitors are useful for preventing a process continuing in the presence of an excessive particle count, so as to minimise the number of wafers or substrates which are improperly processed and effectively damaged.

In a further paper,

Experimental Evidence for Beam Particulate Transport in Ion Implanters, Sferlazzo et al, IIT-92, pages 565–569, an experiment is described in which artificial particulates are inserted into an ion beam and observed to be transported along the ion beam. A video camera is used to observe and record the presence of injected particles being transported by the ion beam. However, there is no discussion in this article of counting particles or measuring the flux of particles.

SUMMARY OF THE INVENTION

In one aspect, the invention provides a method of controlling a semiconductor device manufacturing process for providing desired process conditions in a vacuum chamber. The process includes a plurality of adjustable process parameters for controlling the process conditions.

According to the method, the process is operated to produce the process conditions in the vacuum chamber and, during operation of the process, the flux of contaminant particles in the vacuum chamber caused by the process conditions is measured. At least one of the process parameters is then adjusted in response to the measured contaminant particle flux, to reduce the flux measured during the process.

In this way, a measure of contaminant particle flux is used to adjust a process parameter with a view to minimising the production of contaminant particles in the process.

Preferably, the method described above is applied during an initial setting up or calibration procedure, before process wafers are exposed to the desired process conditions in the vacuum chamber. In this way, the process parameters themselves can be adjusted with a view to minimising the production of contaminant particles in the process.

For example, in an ion beam implantation process, process parameters controlling the ion beam itself may be adjusted in accordance with the above described method, to minimise particle production. The adjusted process parameters may include those controlling the lateral alignment of the beam through the beam line, or parameters controlling the voltage on electrostatic focussing elements of the beam line. The method of the invention for the first time permits these parameters to be optimised for low particle production, and the optimisation may be performed dynamically, in the sense that the effect of parameter change on measured particle flux can be monitored to confirm reduction As mentioned above, the optimisation or controlling process may be conducted as a preliminary set up procedure, but also may be conducted during a live process run to adjust parameters which are not process-critical in order to minimise particle production.

Importantly, the method described above is conducted whilst process conditions are maintained within the vacuum chamber, so that the effect of the controlling method is to provide a closed loop enabling the effect of parameter adjustments in reducing contaminant particle flux to be monitored.

Preferably, in the case of an ion implantation process using a beam of ions for implantation, the flux measuring step mentioned above measures the flux of contaminant particles entrained with said beam. It has been discovered that the measurement of contaminant particles entrained with the ion beam, especially at a location along the ion beam as close as possible to the substrate wafer to be implanted, provides a good indication of the expected level of particulate contamination of the surface of the wafer being implanted. Importantly also, the flux of contaminant particles entrained in the ion beam is well associated with the level of particulate contamination which is dependent on process conditions within the vacuum chamber, and is therefore at least to some extent controllable by varying selected adjustable process parameters.

The present invention also provides semiconductor device manufacturing apparatus comprising a vacuum chamber. The apparatus is operative to provide in the vacuum chamber desired process conditions controlled by a plurality of adjustable process parameters. A particle sensor in the vacuum chamber measures a flux of contaminant particles caused by the process conditions, and a controller is responsive to the measured flux to adjust at least one of the process parameters to reduce the measured flux. In the case where the semiconductor device manufacturing apparatus is an ion implanter having an ion beam generator to generate in the vacuum chamber a beam of ions desired for implantation travelling along a beam path, the particle sensor is preferably located and arranged to measure the flux of contaminant particles flowing along the beam path. The ion beam generator may include a mass filter to remove ions of unwanted mass-to-charge ratio from the ion beam, and the apparatus may further include a holder for a semiconductor wafer to be implanted. Then the particle sensor is preferably located to measure said flux along said ion beam at a location between the filter and the holder.

The particle sensor may comprise a frame structure defining a beam aperture in a plane transverse to the ion beam path. The frame structure is then mounted in the vacuum chamber with the beam aperture aligned with the ion beam path. A light source in the frame structure directs light in said transverse plane across the ion beam path and a light sensor in the frame structure detects light signals indicative of flux of particles illuminated by the light from the light source.

Preferably the frame structure is electrically conducting and is mounted in the vacuum chamber to be at a predetermine potential. In this way the frame structure of the particle sensor can be controlled to have a desired potential as required to assist in controlling the ion beam.

The invention further provides semiconductor device manufacturing apparatus for implanting ions into a semiconductor wafer, wherein the apparatus has a vacuum chamber, an ion beam generator to generate in said vacuum chamber a beam of ions desired for implantation travelling along a beam path, and a particle sensor in the vacuum chamber located and arranged to measure a flux of contaminant particles flowing along the beam path.

Examples of the invention will be described with reference to the accompanying drawings.

DETAILED DESCRIPTION OF THE PREFERRED EMBODIMENTS

Figure 1:
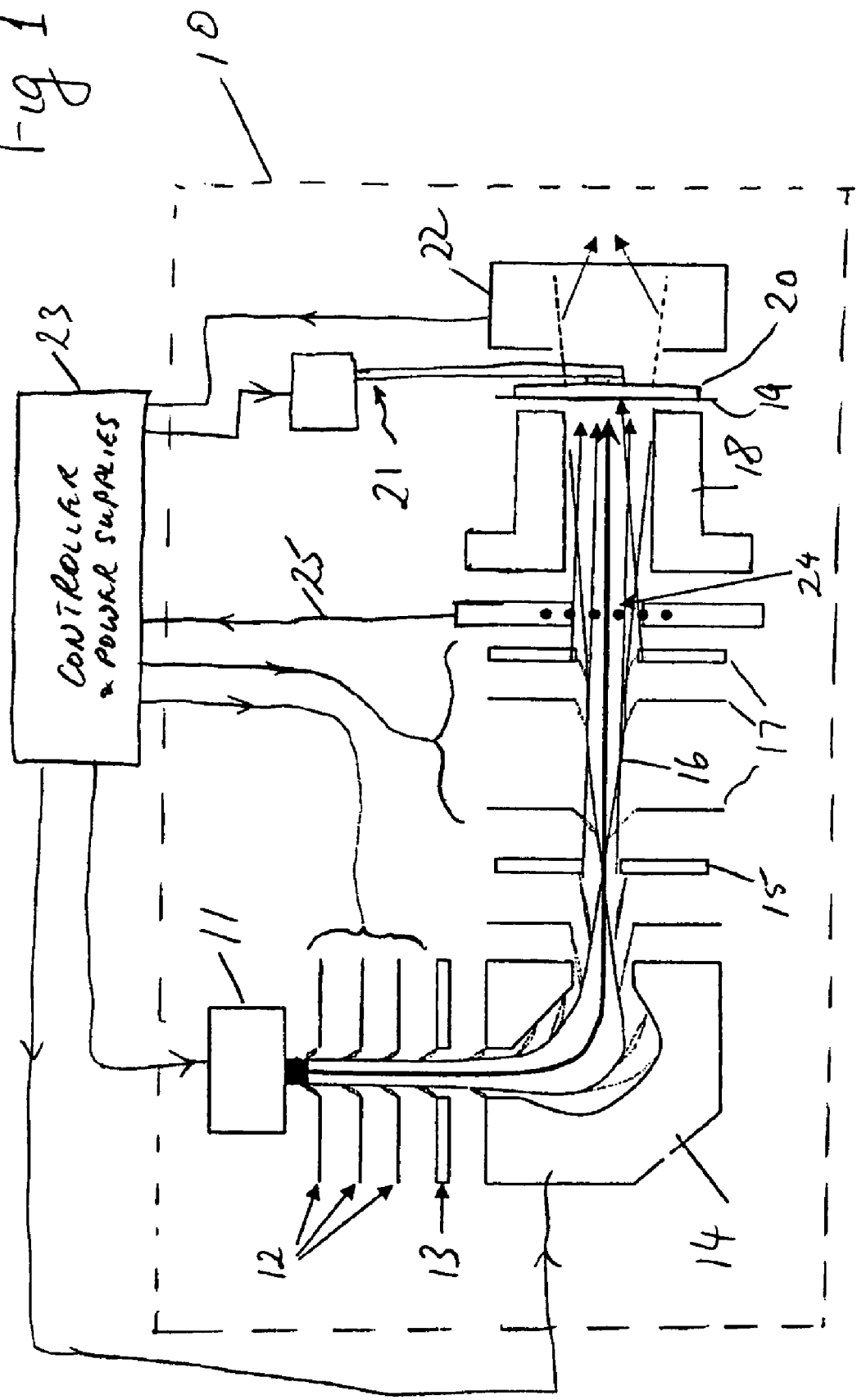
FIG. 1 is a schematic representation of an ion implanter embodying the present invention and FIG. 2 is a further schematic view illustrating a particle sensor located within the vacuum chamber of the ion beam implanter of FIG. 1.

Referring to FIG. 1, the main parts of a typical ion implanter are illustrated within a vacuum chamber illustrated schematically by the box 10. Ions are generated in an ion source 11, e.g. a Bernas type ion source, and extracted to form a beam by extraction electrodes 12. The beam of extracted ions passes through an aperture in shielding or baffle 13 to enter the flight tube of analyser magnet 14. Within the analyser magnet 14, ions in the beam having different mass-to-charge ratios adopt different flight path curvatures and so becomes spatially separated at the exit of the analyser. A mass resolution slit 15 is located at the exit of the analyser to select ions of a desired mass-to-charge ratio for onward transmission and implantation.

In this embodiment, a beam 16 of mass selected ions passes through focussing lenses 17, which may for example be used for accelerating or decelerating the beam to a desired implant energy. The focussed beam passes through a plasma flood system 18 before impinging upon a wafer 19 mounted on a wafer holder 20. The wafer holder 20 is preferably scanned in two dimensions through the beam 16 by a mechanical scanning arrangement shown generally at 21. When during the scan of the wafer 19, the wafer is removed from the ion beam 16, the ion beam bypasses the wafer 19 on the wafer holder 20 to be absorbed in a beam dump 22, typically a faraday.

The ion implanter described thus far forms part of the prior art. Further details of an ion implanter of this kind, in particular having deceleration and focussing optics corresponding to electrodes 17, downstream of the mass resolution slit 15, is described in U.S. Pat. No. 5,969,366, the entire disclosure of which is incorporated herein by reference. Further details of a scanning wafer holder suitable for the holder 21, is described in U.S. Pat. No. 5,641,969, of which the entire disclosure is also incorporated herein by reference. Instead of the batch-type implanter with a scanning wheel as illustrated in the above reference, the wafer holder 21 may also be implemented as set out in published International Application WO 03/088303, which provides a two-dimensional scanning arrangement for a single wafer. In fact, the invention is not confined to any particular mode of scanning of the wafer through the ion beam.

In the described embodiment, the plasma flood system 18 may be as described in U.S. Pat. No. 6,501,081, in which low energy electrons in an argon plasma are introduced into a confinement tube located immediately in front of the wafer to be implanted. As is known, the low energy electrons can be attracted to any positive charge building up on the wafer, thereby preventing damage to the wafer by overcharging during implantation.

The extraction optics represented by electrodes 12 in the embodiment of FIG. 1, may take the form described in U.S. Pat. No. 6,559,454 however, again the invention is not concerned with a particular form of extraction optics used for initially forming the ion beam on extraction from the ion source.

Referring again to FIG. 1, the desired process conditions for appropriate implantation of a wafer by the implanter are set according to the desired implantation recipe. This recipe sets out the species of ion to be implanted (for example singly charged boron ions), the energy at which those ions are to be delivered to the wafer for implantation, the angle or angles between the ion beam and the wafer during implantation, and the total dose per unit area of wafer to be delivered during the implant process. Other recipe requirements may be the maximum allowable non-uniformity of dose over the surface of the wafer, and the maximum allowable variation in energy of the ions being implanted. In addition there may be stipulated maximum allowable variations in angle of implant.

In order to achieve the desired process recipe conditions, an implant controller and power supplies unit 23 adjusts and controls various process parameters of the implanter. These process parameters will include the supply of feedstock material to the ion source, in order to generate the desired implant species, the voltages applied to the ion source in order to optimise production within the ion source of the desired ionic species for implantation, the voltages applied to the extraction electrodes 12, together with the mechanical alignment of the extraction electrodes in order to optimise the extraction of a beam from the ion source at a desired extraction energy, the currents applied to the windings of the electromagnet forming the magnetic analyser 14 in combination with the location and adjustment of the mass resolution slit 15, in order to select the desired mass-to-charge ratio for onward transmission for implantation, the voltages applied to electrodes 17 in order to accelerate or decelerate the selected beam as necessary and provide appropriate focussing for delivery to the substrate for implantation, the delivery of argon and the control of voltages in the plasma flood system 18 to achieve desired neutralisation of charge build up on the wafer during implantation, and the speed and duration of the mechanical scanning of the wafer 19 on holder 20 by means of the scanning mechanism 21. Furthermore, in order to achieve appropriate total dose delivery and dose uniformity, it is necessary to monitor the total current of ions in the beam during the implant process, by means of the faraday 22. During a set up procedure, delivered current of the desired species as measured by the faraday 22 can be maximised by adjustment of various of the control parameters described above. During an implant process, the initial measured beam current, preferably together with continuing beam current measures during the process, permit the process to be controlled to deliver the desired total dosage as required to the wafer.

It is also known, as set out in the prior art references discussed above, to include a particle monitoring sensor within the vacuum chamber of the implanter, in particular in the part of the vacuum chamber in which process wafers are handled and scanned through the implant beam. However, in the prior art the measured flux of particulates is used to provide alarms, which may warn the operator to initiate a cleaning procedure if the particulate count exceeds certain thresholds.

In the embodiment of the present invention as illustrated in FIG. 1, a particle sensor 24 is provided to sense the flux of contaminant particulates and provide a corresponding signal on a line 25 to the controller and power supplies unit 23. Importantly, the measurement of particle flux from the sensor 24 is then used by the controller and power supplies unit 23, with or without operator intervention, to adjust various of the controllable process parameters of the implanter (as discussed above) in order to try and reduce or minimise the measured particle flux. For example, particles may be produced in the implanter by impingement of the ion beam, or the edges thereof, on the various ion beam apertures through which the beam passes between the source and the wafer 19. Adjustment of the electrodes 12 of the extraction optics, for example, can minimise the particles produced at this point. Similar adjustments may be made to reduce the particle count by available adjustment to the input baffle 13 of the mass selector, to the mass selector currents, to the location and width of the mass resolution slit, and to the voltages applied to the focussing electrode 17. In addition, particle count may be reduced by adjusting the voltages applied to the ion source 11.

Therefore, in accordance with this example of the present invention, a particle count from the sensor 24 is used directly to adjust process parameters of the implanter with a view to reducing particle count.

Such an optimisation process may be conducted in a set up procedure before process wafers are implanted. However, the optimisation procedure may also take place during the course of an implant process, either by temporarily halting the implantation, e.g. by removing the wafer from the beam while maintaining the beam itself, and then making adjustments to process parameters to minimise the particle count, before resuming implantation; or in fact by making judicious adjustments in process parameters whilst the implantation of wafers continues.

Importantly, the measured particle count from the particle sensor 24 is used directly to devise adjustments to the input parameters, whilst maintaining process conditions, here the ion beam, in order to attempt to reduce the particle count.

This new way of operating an implanter in response to measured particle count is derived from the understanding that the process conditions themselves can cause a rise in the particle count, so that adjustment of process parameters can reduce the particle count, without the need to go straight to a vacuum chamber cleaning process as in the prior art.

In the example illustrated in FIG. 1, the particle sensor 24 is located and arranged to measure the flux of particles actually entrained with the ion beam 16 being delivered to the wafer 19. In this way, the sensor 24 is directly measuring the flux of particles likely to impact the wafer and cause undesirable contamination. Accordingly, the measurement of particle flux entrained with the beam provides a more direct measurement of the likely particle contamination of the process wafer.

By comparison, prior art particle sensors in the process chambers of ion implanters have been able to measure only the background particle flux within the chamber, or the flux of particles generated at the interface between the beam and the wafer and thrown off the wafer during spinning of the scan wheel type wafer holder.

As shown in FIG. 1, the particle sensor 24 is located to measure the flux of particles entrained with the ion beam at a location between the focussing electrode 17 and the plasma flood system 18. Since the plasma flood system 18 must, of necessity, be immediately in front of the wafer 19 in order to achieve the desired neutralising of charges on the wafer, the particle sensor 24 is effectively located as far downstream as possible along the ion beam 16. In this way, the particle sensor 24 is capable of detecting entrained particles generated over the greater part of the beam line, in order to best represent the flux of particulates likely to impinge on the wafer during processing. If a plasma flood system can be dispensed with for wafer neutralising, e.g. using another charge control process, then the particle sensor may be located immediately in front of the wafer.

Figure 2:
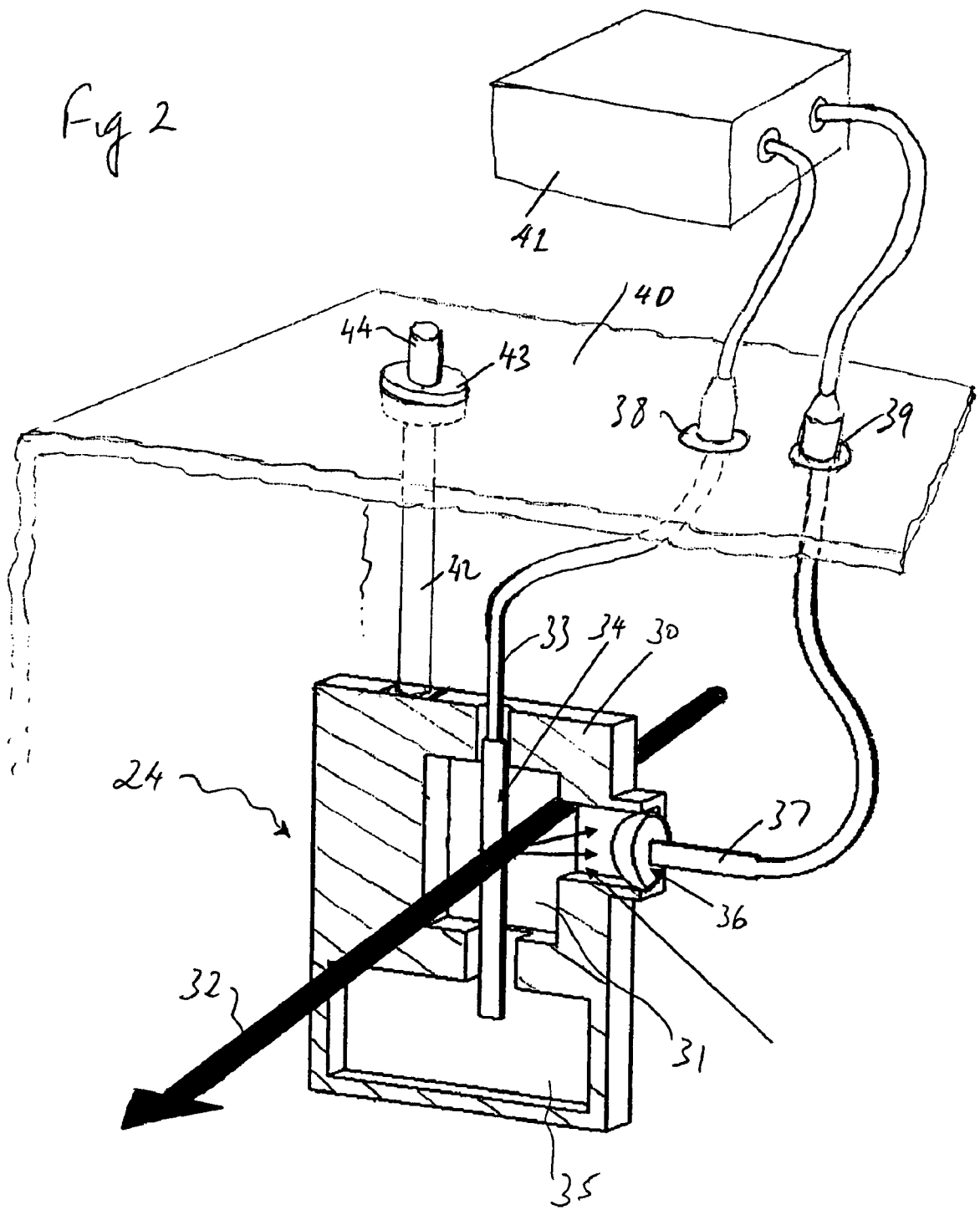

The particle sensor 24 of FIG. 1 is shown in more detail in FIG. 2. The particle sensor 24 comprises a frame 30 defining an aperture 31 which is aligned with the path of the ion beam as indicated by arrow 32 in FIG. 2. In the Figure, the frame 30 is illustrated in a section taken along a mid-plane of the frame 30 transverse to the ion beam direction 32. In this example the particle sensor comprises an input optical fibre 33 delivering light from a laser source, which is directed as a beam 34 across the aperture 31 so as to pass through the beam path 32. The beam 34 then enters an optical beam dump in the opposing side of the frame 30, formed in the illustrated example as a cavity 35 in which the light from the beam 34 can be absorbed and reflections minimised.

As the light in the beam 34 passes through the ion beam 32, any particles passing through the light beam 34, entrained with the ion beam 32, will tend to reflect or scatter light from the beam 34. Reflected or scattered light is collected by a lens 36 mounted in the frame 30 and concentrated in an output fibre 37. The input fibre 33 and output fibre 37 are connected via vacuum connections 38 and 39 through wall 40 of the vacuum chamber to a light source and detector electronics box 41 located external to the vacuum chamber. The light source and detector electronics box 41 are electrically coupled with and effectively form a functional part of the controller and power supplies unit 23 of FIG. 1.

Other forms of particle detector may be used instead of that specifically illustrated in FIG. 2, including the particle detectors described with reference to the above mentioned prior art documents. In a further arrangement, the particle sensor may be a transmission type in which the effect of particles on transmitted light is sensed. The particle sensor should be sufficiently sensitive to provide a reliable count of the particulates entrained with the beam passing through the aperture 31. Sensitivity may be increased by enlarging the illuminated region of the beam within the aperture 31.

As mentioned previously, the particle sensor 24 is mounted in the vacuum chamber so as to be as far downstream along the beam line as possible, in front of the wafer to be implanted. Conveniently, the frame 30 of the particle sensor is formed of conducting material, such as metal. An electrical connection can be made to the frame 30 by means of an electrical conductor 42 leading via a vacuum feedthrough 43 to an electrical terminal 44 located externally of the vacuum chamber wall 40. In this way, the frame 30 of the particle sensor can be connected to an external power supply so that the frame 30 can be electrically biased as required. Then, the frame 30 itself can provide a beam aperture having a controlled potential as may be desired to provide required focussing of the beam, electron suppression or any other function required to assist in control of the ion beam. In particular, the frame 30 of the particle sensor 24 may be electrically connected to have the same potential as an immediately adjacent beam line structure, e.g. the adjacent one of electrodes 17 immediately upstream of the particle sensor 24, or the confinement tube of the plasma flood system 18 immediately downstream of the sensor. In this way, the electrical effect on the beam of the presence of the particle sensor 24 can be minimised, or alternatively controlled and used as required.

Although examples of embodiments of the invention have been described above with particular reference to ion implanters and ion implantation, variants of the invention may be employed in other semiconductor manufacturing processes and with other semiconductor manufacturing equipment. For example, a particle sensor may be used within the chamber of CVD or PVD deposition systems and used to control process conditions within the chamber to minimise the production of particles.

The invention claimed is:

1. A method of controlling a semiconductor device manufacturing process for providing desired process conditions in a vacuum chamber, the process including a plurality of adjustable process parameters for controlling said process conditions, the method comprising the steps of a) operating the process to produce said process conditions in the vacuum chamber, b) during operation of the process, directing a beam of light from a light source across a sample region in the vacuum chamber, collecting light from the light source which is scattered by contaminant particles flowing through said beam of light in said region, and detecting the collected scattered light to measure a flux of the contaminant particles through said region caused by said process conditions, and c) adjusting at least one of said process parameters in response to said measured flux to reduce said flux measured during said process.

2. A method as claimed in claim 1, wherein the semiconductor device manufacturing process to be controlled is an ion implantation process.

3. A method as claimed in claim 2, wherein the ion implantation process provides a beam of ions for implantation, into a wafer, said sample region extends through said beam of ions upstream of said wafer, and said flux measuring step measures the flux of contaminant particles entrained with said beam.

4. Semiconductor device manufacturing apparatus comprising a vacuum chamber, the apparatus being operative to provide in said vacuum chamber desired process conditions controlled by a plurality of adjustable process parameters, a particle sensor defining a sample region in the vacuum chamber to measure a flux of contaminant particles through said sample region caused by said process conditions, said particle sensor having a light source to direct a beam of light across said region, a light sensor arranged to collect light from the light source which is scattered by said contaminated particles flowing through said beam of light in said region, and to detect light signals in the collected light to measure said flux, and a controller responsive to said measured flux to adjust at least one of said process parameters to reduce said measured flux.

5. Apparatus as claimed in claim 4, for implanting ions into a semiconductor wafer, said apparatus including an ion beam generator to generate in said vacuum chamber a beam of ions desired for implantation traveling along a beam path, wherein said particle sensor is located and arranged to measure the flux of contaminant particles flowing along said beam path.

6. Apparatus as claimed in claim 4, wherein said ion beam generator includes a mass filter to remove ions of unwanted mass-to charge ratio from said beam, the apparatus further includes a holder for a semiconductor wafer to be implanted, and said particle sensor is located to measure said flux along said beam path between said filter and said holder.

7. Apparatus as claimed in claim 6, wherein the apparatus further includes an acceleration/deceleration unit to adjust the energy of ions in the beam from said mass filter, and said particle sensor is located to measure said flux along said beam path between said acceleration/deceleration unit and said holder.

8. Apparatus as claimed in claim 5, wherein the apparatus further includes a neutralizer located in front of said holder, operative to reduce electrostatic charging of a product wafer on the holder during implantation, said neutraliser having a guide tube surrounding the beam in front of the wafer holder, and said particle sensor is located to measure said flux along said beam path immediately in front of said guide tube.

9. Apparatus as claimed in any of claims 5 to 8, wherein said particle sensor comprises a frame structure defining a beam aperture in a plane transverse to said ion beam path, said frame structure being mounted in said vacuum chamber with said beam aperture aligned with said ion beam path, said light source being mounted in the frame structure directing light in said plane across said ion beam path, and said light sensor being mounted in the frame structure to detect said light signals indicative of said flux.

10. Apparatus as claimed in claim 9, wherein said light source produces a beam of light across said ion path and the frame structure includes a light beam dump located opposite said light source to receive and absorb said light beam.

11. Apparatus as claimed in either of claims 9 and 10, wherein the frame structure is electrically conducting and is mounted in said vacuum chamber to be at a predetermined potential.

12. Apparatus as claimed in claim 11, wherein the frame structure is electrically connected to an adjacent beam aperture of the apparatus.

13. Apparatus as claimed in claim 11, including a mount which electrically insulates the frame structure, and an electrical lead out from the vacuum chamber providing a connection to enable a desired bias potential to be applied to the frame structure.

14. Semiconductor device manufacturing apparatus for implanting ions into a semiconductor wafer, said apparatus having a vacuum chamber, an ion beam generator to generate in said vacuum chamber a beam of ions desired for implantation traveling along a beam path, a wafer holder to support a wafer for implantation, and a particle sensor in the vacuum chamber located and arranged to measure a flux of contaminant particles flowing along said beam path through a sample region in front of said wafer support, said particle sensor having a light source directing light across said ion beam path and a light sensor arranged to collect light from the light source which is scattered by contaminant particles in the ion beam and to detect light signals in the collected light to measure said flux.

* * * * *